United States Patent [19]

Kihara et al.

[11] 4,250,493
[45] Feb. 10, 1981

[54] ANALOG-TO-DIGITAL CONVERTER EMPLOYING CONSTANT-CURRENT CIRCUIT INCORPORATING MISFET

[75] Inventors: Toshimasa Kihara, Kodaira; Toshiro Tsukada, Kokubunji, both of Japan

[73] Assignee: Hitachi, Ltd., Japan

[21] Appl. No.: 925,790

[22] Filed: Jul. 18, 1978

[30] Foreign Application Priority Data

Jul. 22, 1977 [JP] Japan .................................. 52-87417

[51] Int. Cl.³ ............................................ H03K 13/02
[52] U.S. Cl. ..................... 340/347 NT; 340/347 AD; 307/246; 307/304
[58] Field of Search ................. 340/347 AD, 347 NT; 324/99 D, 111; 307/297, 304; 323/4, 9, 19

[56] References Cited

U.S. PATENT DOCUMENTS

| | | | |
|---|---|---|---|
| 3,678,502 | 7/1972 | Kienzler | 340/347 M X |
| 4,020,367 | 4/1977 | Yamashiro et al. | 307/297 |
| 4,100,437 | 7/1978 | Hoff | 307/297 |
| 4,117,353 | 9/1978 | Butler et al. | 307/297 |
| 4,165,478 | 8/1979 | Butler et al. | 323/19 |

OTHER PUBLICATIONS

Beck, Direct Digital-To-Analog Values Storage, IBM Technical Disclosure Bulletin, vol. 9, No. 4, 09001966, p. 380.

Cope et al., Engine-Temperature Monitor Warns Pilot of Danger, 06241966, Electronics, p. 114.

*Primary Examiner*—Thomas J. Sloyan
*Attorney, Agent, or Firm*—Craig & Antonelli

[57] ABSTRACT

The constant-current circuit consists of two MISFETs connected in series and a gate bias circuit for these MISFETs. The drain voltage of the first MISFET is maintained substantially constant by the source voltage of the second MISFET. The first MISFET does not sustain the channel length modulation, because its drain voltage is substantially constant. Consequently, a constant output current is obtained through the drain of the second MISFET.

3 Claims, 9 Drawing Figures

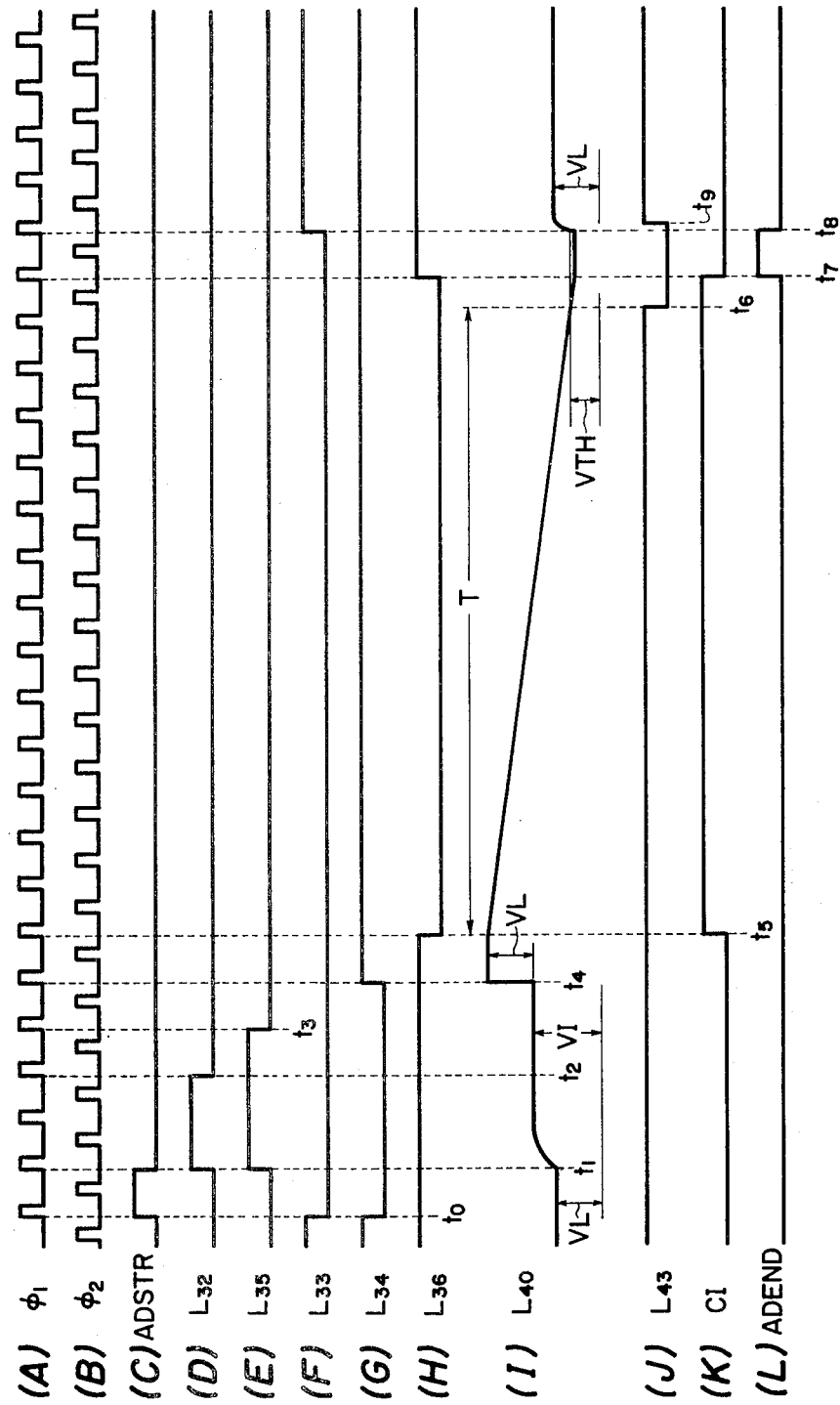

ANALOG-TO-DIGITAL CONVERTER EMPLOYING CONSTANT-CURRENT CIRCUIT INCORPORATING MISFET

BACKGROUND OF THE INVENTION

The present invention relates to a constant-current circuit incorporating an insulated-gate type field-effect transistor (referred to simply as MISFET, hereinafter) and to a signal converter making use of the constant-current circuit.

The drain current of MISFET, e.g. an enhancement-mode MISFET, in the saturated state of the same, is substantially constant even when the drain voltage is varied. This characteristic can conveniently be used for realizing a constant-current circuit. The drain current of the enhancement-mode MISFET, however, exhibits a tendency to increase as the drain voltage is increased, due to the channel length modulation. Thus, the constant-current circuit incorporating the enhancement-mode MISFET does not always exhibit a good constant-current characteristic.

SUMMARY OF THE INVENTION

It is therefore a major object of the invention to provide a constant-current circuit incorporating MISFETs and having a highly precise constant-current characteristic.

It is another object of the invention to provide a constant-current circuit suitable for use in analog to digital converter.

It is still another object of the invention to provide a device incorporating a highly precise constant-current circuit.

To these ends, according to the invention, there is provided a circuit having two enhancement-mode MISFETs which are connected in series to each other, such that the source of the first MISFET and the drain of the second MISFET are connected in common. Further, a suitable bias voltage is applied across the gate of the first MISFET so as to make the second MISFET operate in its saturated state. Consequently, according to the invention, the drain voltage of the second enhancement-mode MISFET is fixed to ensure a stable constant-current output obtained from the drain of the first enhancement-mode MISFET.

The above and other objects, as well as advantageous features of the invention will become more clear from the following description of the preferred embodiments taken in conjunction with the accompanying drawings in which:

BRIEF EXPLANATION OF THE DRAWINGS

FIG. 8 shows a time chart for explaining the operation of the circuit as shown in FIG. 7.

DESCRIPTION OF THE PREFERRED EMBODIMENT

Hereinafter, the invention will be described in more detail with reference to the accompanying drawings.

Figure 1:
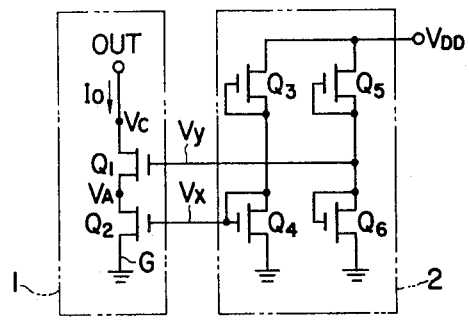
FIG. 1 is a circuit diagram of a constant-current circuit embodying the present invention.

Referring first to FIG. 1 showing the circuit arrangement of a first embodiment of the invention, the circuit of the first embodiment is constituted by a constant-current circuit 1 and a bias circuit 2 associated with the constant-current circuit 1.

The constant-current circuit 1 has two enhancement-mode MISFETs Q1,Q2 which are connected in series between an output terminal OUT and a reference voltage terminal G. The bias circuit 2 is provided for making the MISFETs Q1,Q2 operate in their saturated states. The bias voltage Vx applied across the gate of the MISFET Q2 is formed by a potential dividing circuit constituted by a depletion-type MISFET Q3 and an enhancement-mode MISFET Q4. At the same time, the bias voltage Vy applied across the gate of the MISFET Q1 is formed by another potential dividing circuit constitued by a depletion-type MISFET Q5 and an enhancement-mode MISFET Q6. The bias voltage Vx is determined by the potential dividing ratio of the series connection of the MISFETs Q3 and Q4, and by the power source voltage $V_{DD}$. The above-mentioned ratio of division of potential in turn is determined by the ratio of a first ratio of channel width (W) to channel length (L) of MISFET Q3 (W/L) to a second ratio W/L of MISFET Q4.

Similarly, the bias voltage Vy is determined by the potential dividing ratio of the series connection of the MISFETs Q5 and Q6, and by the power source voltage $V_{DD}$.

These MISFETs Q1 to Q6 are formed on a common semiconductor substrate, by known semiconductor integrated circuit technique. According to this arrangement, the fluctuation of the characteristics of the MISFETs relative to one another is relatively small, even if there are some fluctuations of the characteristics of respective MISFETs. More specifically, the tendency or direction of the change of threshold voltages of MISFETs Q4,Q6, which provides the above-mentioned bias voltages Vx,Vy, is the same as that of the change of threshold voltages of the MISFETs Q1,Q2. It is therefore possible to apply suitable bias voltages across the MISFETs Q1,Q2.

The bias voltages Vy and Vx are so determined as to make the MISFETs Q1,Q2 operate in their saturated conditions. In order to make the MISFET operate in its saturated state, it is necessary to make the drain voltage of the MISFET larger than the voltage differential between the gate voltage and the threshold voltage of the same.

Thus, the voltages used in the first circuit are determined to satisfy the following equations (1), (2).

$$|V_A| > |V_x - V_{th2}| > 0 \tag{1}$$

$$|V_C| > |V_y - V_A - V_{th1}| \tag{2}$$

In above equations, voltages $V_A$, $V_C$, $V_{th1}$ and $V_{th2}$ denote, respectively, the drain voltage of the MISFET Q2, drain voltage of the MISFET Q1, threshold voltage of the MISFET Q1 and the threshold voltage MISFET Q2.

As constant voltages Vy,Vx for making the MISFETs operate Q1,Q2 in their saturated states are applied across the gates of these MISFETs, the drain currents of the MISFETs Q1,Q2 are changed in the opposite directions when the voltage $V_A$ at the junction point of these MISFETs Q1,Q2 is changed. Thus, these MISFETs Q1,Q2 act to restrain the change of the voltage $V_A$, so that the drain voltage of the MISFET Q2 is kept constant. Consequently, the aforementioned channel length modulation does not take place in the MISFET Q2, so that a highly precise constant-current output Io is obtained.

If the drain voltage $V_C$ of the MISFET Q1 is lowered to reduce the output current Io, the drain voltage $V_A$ of the MISFET Q2 must also be lowered, because the gate voltage Vx of the MISFET Q2 is kept constant. As the drain voltage $V_A$ becomes lower, the voltage differential $Vy-V_A$ between the gate and source of the MISFET Q1 is made larger, because the gate voltage Vy of the MISFET Q1 is constant, so that the drain current Io of the MISFET Q1 is made larger.

To the contrary, when the current Io is made larger due to an increase of the drain voltage $V_C$, the drain voltage $V_A$ of the MISFET Q2 is automatically made higher. This increase of the drain voltage $V_A$ in turn makes the voltage differential $Vy-V_A$ smaller, so as to reduce the drain current of the MISFET Q1.

It will be understood that the change of the current Io is automatically suppressed, thanks to the negative feedback function which is performed in relation with the change of the current Io. Consequently, a highly precise constant-current characteristic is always available at the terminal OUT.

Figure 2:
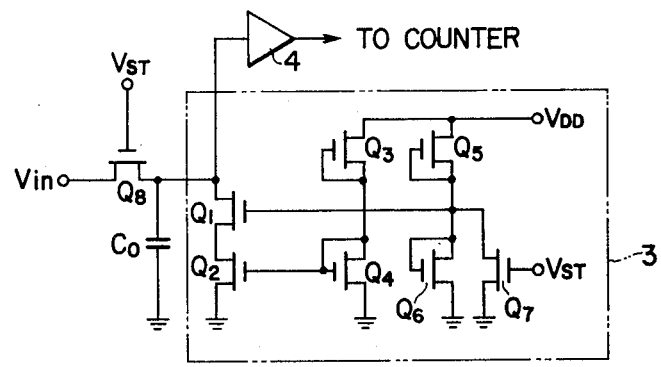
FIG. 2 is a circuit diagram of an A/D converter.

FIG. 2 is a circuit diagram of an analog to digital converter (referred to as A/D converter) embodying the present invention, incorporating the above-explained constant-current circuit of the invention.

This A/D converter has a switching MISFET Q8 connected between an input terminal Vin and a capacitor CO, adapted for charging the capacitor CO. The A/D converter further has a constant-current 3 connected in parallel with the capacitor CO, a voltage-comparator circuit 4 having an input terminal connected to one end of the capacitor CO, and a counter (not shown) adapted to commence a counting of clock pulses at the instant of falling down of a timing pulse $V_{ST}$ and to cease the counting operation upon receipt of an output from the voltage-comparator circuit 4.

The operation of the constant-current circuit 3 is under the control of a switching MISFET Q7, such that a constant-current is caused to flow through the series circuit constituted by the MISFETs Q1,Q2, when the MISFET Q7 is turned off.

This circuit is adapted to produce a digital signal in proportion to an analog input voltage, through causing a discharge from the capacitor CO, which has been charged by the analog input voltage, by way of the constant current available at the constant-current circuit 3.

In operation, as the timing pulse $V_{ST}$ is made to assume the higher level, the switching MISFETs Q7,Q8 are turned on, while the constant-current MISFET Q1 is turned off. In this condition, the capacitor CO is charged through the MISFET Q8 to the level of the analog input voltage Vin. Then, as the timing pulse $V_{ST}$ falls down to assume the lower level, the MISFET Q8 is turned off, and the MISFET Q7 of the constant-current circuit 3 is also turned off. Consequently, a discharge from the capacitor CO, through the MISFETs Q1,Q2, is started, so that the voltage across the capacitor CO commences to come down. The time length, between the instant at which the discharge is started to the instant at which the voltage across the capacitor CO has come down to the level of the threshold voltage of the voltage comparator 4, is in direct proportion to the voltage to which the capacitor CO has been charged by the time immediately before the start of the discharge. The aforementioned counter is started, simultaneously with the start of the discharge, to count the number of clock pulses which are separately generated at a constant period. The counter is stopped when the voltage comparator 4 detects that the voltage across the capacitor CO has been lowered to the level of the threshold voltage of the voltage comparator 4, so as to cease the counting operation. Consequently, the number of pulses counted by the counter gives a digital value which is in direct proportion to the level of the analog input signal.

The constant-current circuit 3 incorporated in the A/D converter as shown in FIG. 2 exhibits a good constant-current characteristics irrespective of the level of the voltage across the capacitor CO. Therefore, the rate at which the voltage across the capacitor CO is lowered is maintained precisely constant, independently of the level of the same voltage. For this reason, the aforementioned time length from the instant of the start of the discharge to the instant at which the voltage across the capacitor CO is lowered to the threshold voltage of the voltage-comparator circuit 4 is precisely in direct proportion to the level of the voltage to which the capacitor CO has been charged by the time immediately before the start of the discharge.

Figure 3:
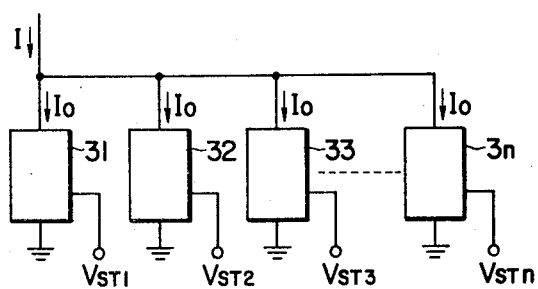
FIG. 3 is a block diagram of another constant-current circuit embodying the invention.

FIG. 3 shows a block diagram of a multi-value constant-current circuit which is another embodiment of the invention.

This circuit includes a plurality of constant-current circuit 3 which are connected in parallel with one another, each of which having a switching MISFET Q7 as shown in FIG. 2. This multi-value constant-current circuit provides n different constant currents, through a selective control of the MISFETs corresponding to the switching MISFET Q7 in respective constant-current circuits $3_1$ to $3_n$.

The circuit as shown in FIG. 3 can be used, for example, in the A/D converter as shown in FIG. 2. If only a low precision of the A/D conversion is required, the time required for the conversion can be shortened by increasing the rate of the voltage drop of the capacitor, through adopting a larger constant current.

Figure 4:
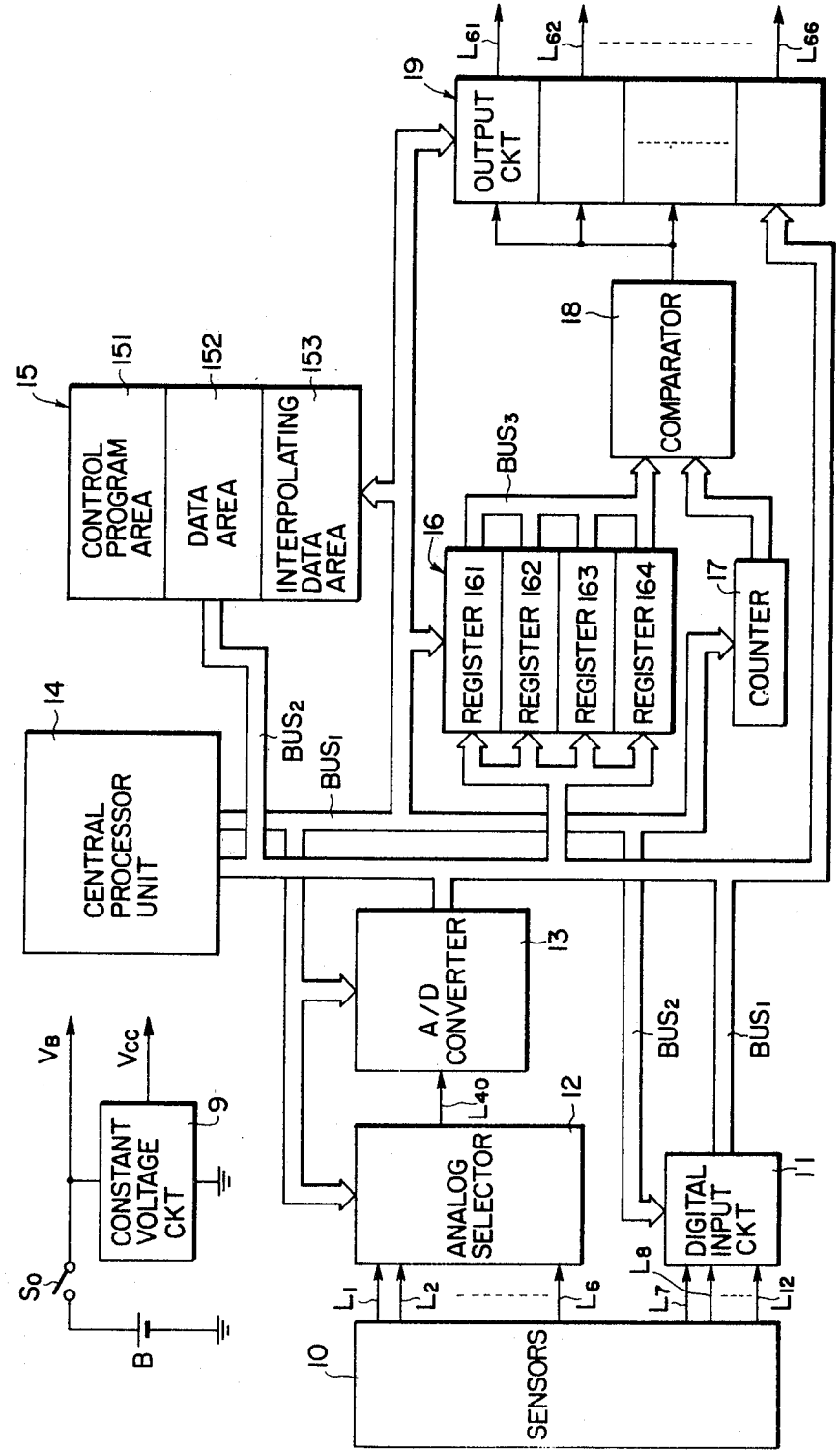
FIG. 4 is a block diagram of a system for controlling an automobile engine.

FIG. 4 is a block diagram of an electronic control system for controlling an automobile engine, incorporating the constant-current circuit in accordance with the invention.

Figure 5:
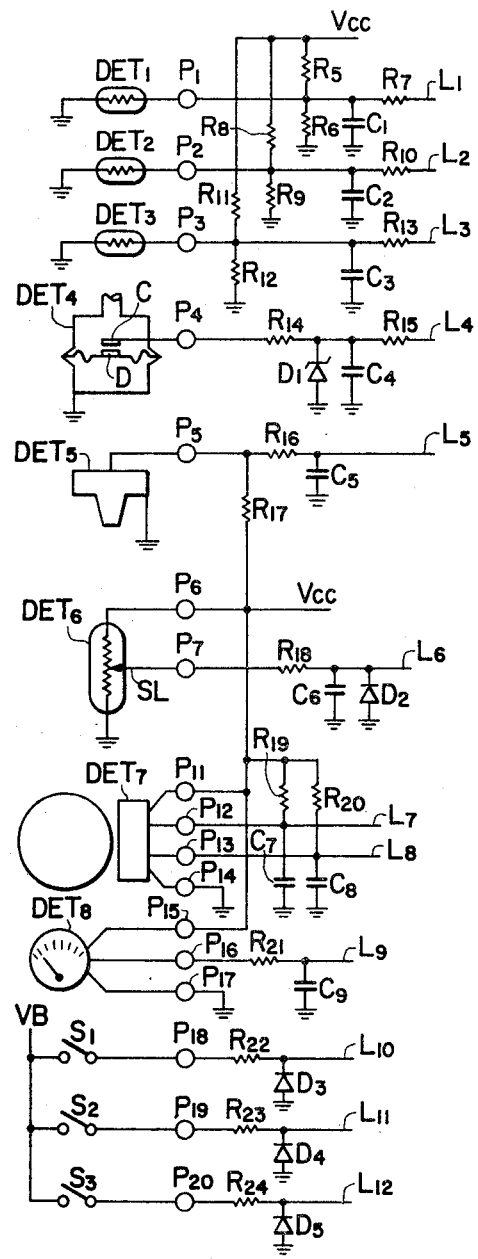
FIG. 5 is a detailed circuit diagram of the block 10 as shown in FIG. 4.

Referring to FIG. 4, various sensors for sensing the state of the engine are included by a block 10, the detail of which is shown at FIG. 5. In FIG. 5, DET 1 denotes a thermistor for detecting the temperature of the cooling water for cooling the engine. This thermistor DET 1 is connected in series to a resistor R5 through a terminal P1, and is disposed in parallel with the resistor R6. Since the thermistor DET 1 has a negative temperature coefficient, the divided voltage of the source voltage Vcc available at the point to which the resistor R5, resistor R6 and the thermistor DET 1 are connected, is lowered as the temperature of the cooling water gets higher. A capacitor C1 is used to absorb the noise at above-mentioned point to which the resistors R5,R6 and the thermistor DET 1 are commonly connected. The voltage available at the above-mentioned point is delivered to a line L1, through a resistor R7.

Symbol DET 2 denotes a thermistor for detecting the suction air temperature. Thus, a voltage corresponding to the suction air temperature appears on the line L2. Similarly, a voltage corresponding to the exhaust gas temperature, generated by a exhaust gas temperature detecting thermistor DET 3, appears on a line L3.

DET 4 is a sensor for detecting the exhaust gas pressure. A contact C connected to one of the terminal P4 of the pressure sensor DET 4 is adapted to be grounded in accordance with the movement of a diaphragm D. This sensor is used for the purpose of controlling an exhaust gas recirculator adpated to reduce the nonxious component in the exhaust gases.

An oxygen concentration sensing element DET 5 is adapted to change its conductivity in response to the concentration of the oxygen in the exhaust gases.

A suction (intake) air flow-rate sensor DET has a slide contact SL the position of which is changed in accordance with the intake air flow rate, so that a voltage corresponding to the intake air flow rate is obtained from a terminal P7.

A crank angle sensor DET 7 is adapted to detect the angular position of the crank shaft of the engine. This sensor receives the power source voltage Vcc through its terminals P11,P14, and produces pulse signals through terminals P12,P13 upon detecting spcific crank angles. For instance, a pulse signal is obtained from the terminal P12 when the crank angle is 0°, while another pulse signal is available at the terminal P13 when the crank angle is 120°.

An engine speed detector DET 8 delivers through a terminal P16 a pulse signal of a frequency corresponding to the engine revolution speed.

A symbol S1 designates a starter switch of the electric circuit of the engine, while S2 and S3 designate switches which are adapted to be closed when the throttle valve of the engine is fully closed and fully opened, respectively.

Turning again to FIG. 4, a reference numeral 11 denotes a digital signal input circuit adapted to receive signals derived from the lines L9 to L12. This input circuit is adapted to select the signals on the lines L7 to L12 and convert the level of the selected signal, while being controlled by a signal derived from the control BUS line BUS 1. The level-converted signal is delivered from this circuit to a data bus line BUS 2.

An analog selector 12 is adapted to select the signals on the lines L1 to L6, under the control of the signal from the control bus line BUS 1, and transfers the selected signal to a line L40.

An Analog to Digital Converter (ADC) converts the analog signal on the line 40 into a digital signal, under the control of the signal derived from the control bus line BUS 1.

The above-mentioned analog selector 12 and the ADC 12 will be described later in more detail, with specific reference to FIGS. 7 to 9.

A Central Processor Unit (CPU) denoted by 14 controls, through the control bus line BUS 1, the above-mentioned circuits and other circuits which will be described hereinunder, and to perform data processing of the data delivered from the data BUS line BUS 2.

A reference numeral 15 designates a memory which includes a control program area 151 storing the content and procedure of the processing to be performed by the CPU, a data area 152 adapted to store the converted digital signal, and an area for storing interpolating data which is determined in accordance with various engine characteristics.

A register file 16 consists of registers 161 to 164 each of which reads the data on the data bus line BUS 2, under the control of the signal derived from the control bus line BUS 1, and delivers the data to another data bus line BUS 3 also under the control of the signal from the control bus line BUS 1.

A counter 17 is adapted to count the clock signals, under the control of the signal from the control bus line BUS 1.

A digital comparator 18 produces a coincidence signal when the content of the register selected from the registers 161 to 163 coincides with the content of the counter 17. The output from the comparator 18 is regarded as the control signal at a time appointed by the selected register.

An output circuit 19 includes a plurality of memory circuits (not shown) which are adapted to be set by the control bus line BUS 1 and reset by the output from the comparator 18. Various devices as shown in FIG. 6 for the automobile engine are driven in accordance with the signals derived from respective one of the output lines L61 to L65 of this output circuit.

Figure 6:
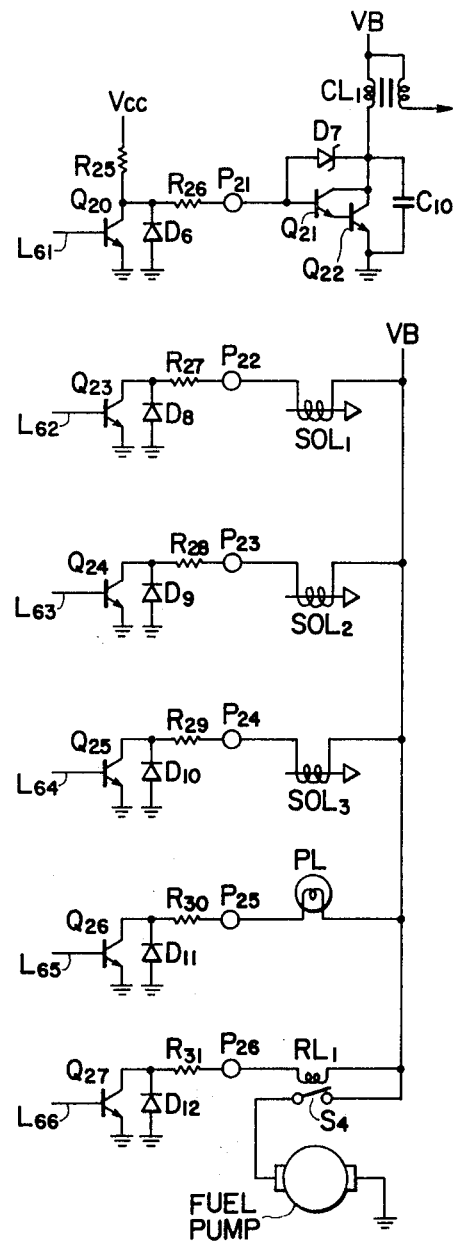
FIG. 6 is a circuit diagram of a circuit adapted to be connected to the block 19 of FIG. 4.

Referring now to FIG. 6, an ignition coil CL1 has a primary coil which is connected between the power source terminal $V_B$ and the collectors of transistors Q21,Q22 which are arranged in Darlington connection, and a secondary coil which is connected between the power source terminal $V_B$ and the distributor (not shown) of the automobile. The output from an inverter constituted by a transistor Q20 and a resistor R25 is changed from low level to high level, as the signal on the line 61 is changed from high level to low level, so that the above mentioned Darlington connection comes to conduct, thereby to generate a high voltage in the primary coil of the ignition coil CL1. This high voltage is applied across one of the ignition plugs selected by the distributer, so as to produce a spark on that plug.

A solenoid SOL 1 is adapted to control the fuel injector (not shown) of the engine, and is connected between the power source terminal $V_B$ and the collector of a transistor Q23. Pulses corresponding to the duty ratio of the pulse signal applied to the line L62 are made to flow through the solenoid SOL 1 which in turn controls the fuel injector in accordance with the mean current which is determined by the above-mentioned duty ratio.

Another solenoid SOL 2 is provided for controlling a valve (not shown) of the exhaust gas recirculator. This solenoid SOL 2 controls the valve in accordance with the duty ratio of the pulse signal delivered to the line L63.

Still another solenoid SOL 3 controls the throttle valve in the suction manifold of the engine during the idling of the latter, in accordance with the duty ratio of the pulse signal delivered to the line L64.

A symbol PL designates an engine temperature warning lamp. When the level of the signal on the line L65 is turned to the higher level, a transistor Q26 is caused to conduct, thereby to put the lamp PL on.

A relay RL 1 has a make contact S4 connected to an electromagnetic fuel pump. The signal on the line L66 is turned to assume the higher level, simultaneously with the closing of a key switch SO of FIG. 5, so that the fuel pump is started.

Referring again to FIG. 4, power source voltage is supplied to respective circuits, as the key switch SO is closed. Then, the central processor unit CPU controls the circuits in a time-dividing manner, in accordance with the control program stored in the memory area 151. More specifically, at first instructions are given by the CPU 14 to the analog selector 12 and the A/D converter 13 to turn them into operation. The digital data obtained from the converter 13 is written in the predetermined address of the memory area 152.

The CPU 14 reads the selected digital data and forms an address appointment information on the basis of several bits of the digital data, and then reads memory informations from at least two adjacent memory addresses in the memory area 153. Interpolating data for the engine control are previously written in respective addresses in the memory area 153, in accordance with the characteristics of the engine to be controlled.

For instance, when the digital data to be selected are the engine revolution speed data, interpolating data concerning the ignition timing have been written in the memory address in the memory area appointed by the engine revolution speed data.

Similarly, when the digital data to be selected are the cooling water temperature data and the engine revolution speed data, interpolating data for controlling the fuel injector have been written in the appointed memory address in the memory area 133. Also, interpolating data for controlling the throttle valve have been written in the memory address appointed by the throttle switch S2, engine revolution speed data and the cooling water temperature data. Further, interpolating data for controlling the exhaust recirculator valve are written in the memory address selected by the exhaust gas pressure data, exhaust gas oxygen concentration data and the engine revolution speed data.

The CPU 14 performs an arithmetic operation to work out the optimum control data, from the read out digital data and two interpolating data, and writes the result of the operation in corresponding registers 161 to 164. More specifically, data concerning the ignition timing, fuel injector, exhaust gas recirculator and the throttle valve opening in the idling are written in the registers 161,162,163 and 164, respectively.

The CPU 14 makes the register 161 deliver the ignition timing data to the data bus line BUS 3, in accordance with the pulse signals derived from the crank angle sensor DET 7, and to make the counter 17 commence the counting. At the time instructed by the register 161, the comparator 18 detects the coincidence of two digital data. The output circuit 19 then delivers a signal for driving the ignition coil CL1 to the line 61, over a predetermined time length from the time of the detection of the coincidence.

Subsequent to the completion of the ignition control, the output from the register 162 is delivered to the data bus line BUS 3 and, at the same time, the counter turns to the counting. The comparator 18 detects the coincidence of two kinds of input signals, when the content of the counter 17 comes to coincide with the content of the register 162. The output circuit 19 then delivers a pulse signal to the line 62, over a time length appointed by the content of the register 162. The fuel injector is controlled by this pulse signal on the line 62.

At the subsequent instant, the ignition timing control in accordance with the content of the register 161 is performed again and, then, the control of the exhaust gas recirculator is performed in accordance with the content of the register 163. The signals on the lines L61 to L66 are thus delivered by a time devision.

Figure 7:
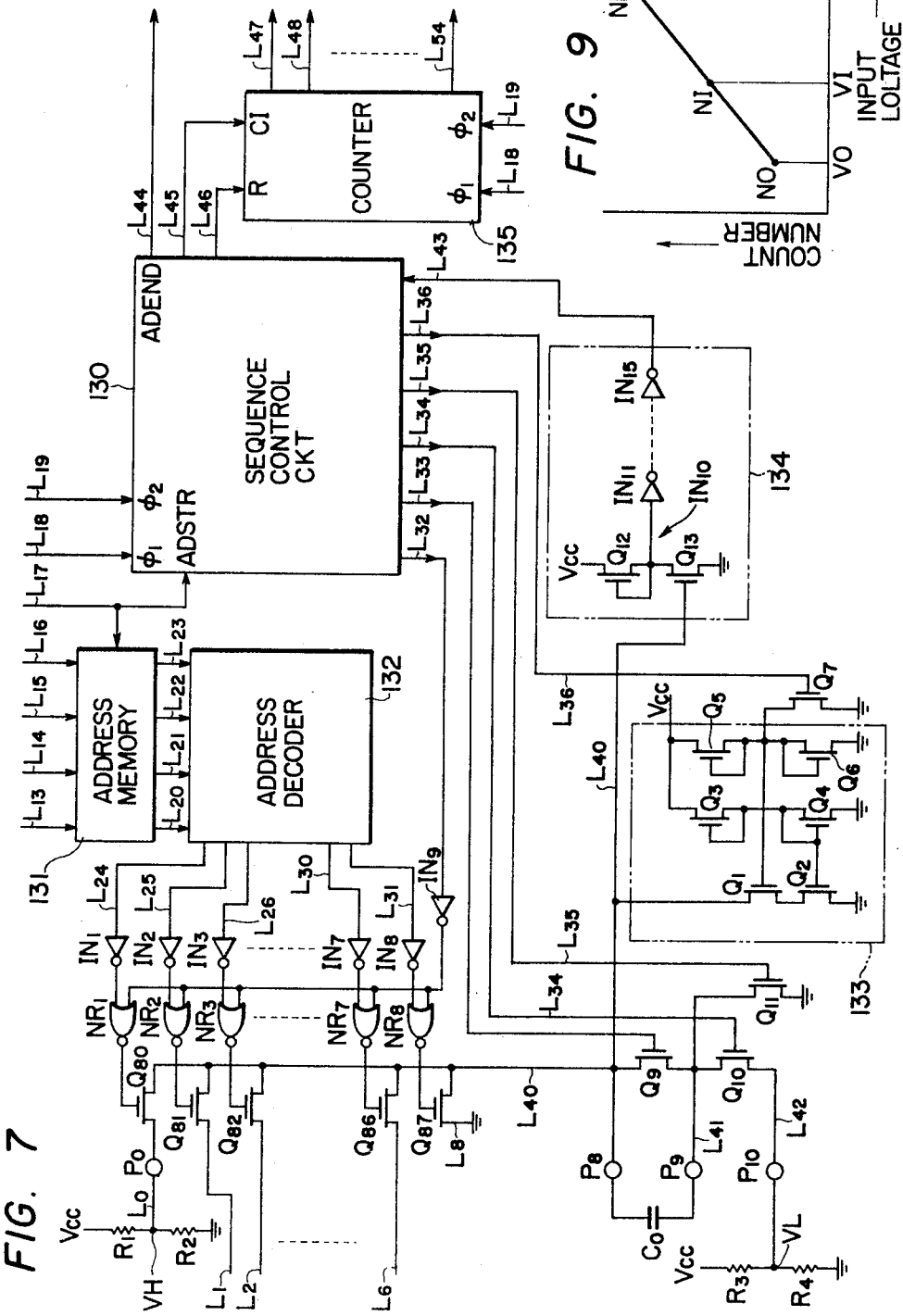
FIG. 7 is a detailed circuit diagram of the blocks 12 and 13 as shown in FIG. 4.

FIG. 7 shows the detail of the analog converter 12 and the A/D converter 13 which are shown as blocks in FIG. 4. In FIG. 7, a sequence control circuit 130 is adapted to deliver various control signals which will be described later, upon receipt of an A/D conversion start signal ADSTR through a line 17 from the CPU 14, clock signals $\phi 1, \phi 2$ through lines L18,L19 from a clock signal generating circuit (not shown) and voltage comparison signal through a line L43 from a voltage comparator circuit 134.

An address memory 131 receives 4-bit address signal corresponding to the sensor to be selected, from the CPU 14, through lines L13 to L16. This address memory 131 reads and stores the address signals on the lines L13 to L16, upon receipt of the start signal on the line L17.

An address decoder designated at 132 receives the address signals derived from the address memory 131, through lines L20 to L23, and delivers its output to a line selected out of the lines L24 to L31 in accordance with the address signal.

A reference numeral 133 denotes a constant-current circuit same as that shown in FIG. 1.

The aforementioned voltage comparator circuit 134 consists of 6 (six) cascade-connected inverters IN10 to IN15. Each inverter includes, as in the illustrated inverter IN10, a MISFET Q13 of enhancement mode adapted to receive the input at its gate, and a depletion mode load MISFET Q12 connected between the power supply Vcc and the drain of the MISFET Q13. The gate and source of the MISFET Q12 are connected to each other.

A counter designated at a numeral 135 is adapted to receive a count input signal CI and a reset signal R from the sequence control circuit 130, through lines L45,L46, as well as clock signals $\phi 1, \phi 2$ from the clock signal generating circuit (not shown) through lines L18, L19. This counter 135 counts the clock signal while it receives the count input signal CI, and delivers an 8-bit count signals to lines L47 to L54.

In FIG. 7, MISFETs Q80 to Q87 are adapted to receive at their gates the output signals derived from corresponding one of NOR circuits NR1 to NR8. Each of these MISFETs conducts and cuts off when the output level from corresponding NOR circuit is high and low, respectively.

The MISFET Q80 receives the output voltage VH from a potential dividing circuit consisting of resistors R1 and R2, through a terminal P0, while MISFETs Q81 to Q86 receive output voltages derived from respective sensors as shown in FIG. 5, through lines L1 to L6, respectively. MISFETs Q9 to Q11 receive at their gates the control signal derived from the sequence control circuit 130.

A capacitor CO is connected between the source and the drain of the MISFET Q9, through terminals P8 and P9, while the MISFET Q10 receives the output voltage VL derived from a potential dividing circuit consisting of resistors R3,R4, through a terminal P10. The output voltage VL from the second-mentioned potential dividing circuit is selected to be lower than the output voltage VH from the first-mentioned potential dividing circuit.

In FIG. 7, the analog selector 12 as shown in FIG. 4 includes the address memory 131, address decoder 132, inverters IN1 to IN8, NOR circuits NR1 to NR8 and enhancement mode MISFETs Q80 to Q87, while the A/D converter 12 is constituted by other circuits than mentioned above.

The above mentioned circuits constituting the analog selector and the A/D converter as shown in FIG. 7 can be formed on a common substrate as a MIS integrated circuit device and accommodated in a common package, except the resistors R1,R2 connected to the terminal P0, the capacitor CO connected between the terminals P8 and P9 and the resistors R3,R4 connected to the terminal P10.

As will be understood from the following description, the circuit as shown in FIG. 7 affords a wide range of analog input voltage, and a high precision of conversion of the analog input signal to digital signal.

FIG. 8 shows the time charts of operation of the circuit as shown in FIG. 7. Before the analog to digital conversion is started, the low level signal of logical value "0" is delivered to the line L32 from the sequence control circuit 130, and the NOR circuits NR1 to NR8 receive a high level signal "1" through the inverter IN9, so that the MISFETs Q81 to Q87 are in cut-off condition. At the same time, since a "1" level signal is available at lines L33 and L34, the MISFETs Q9 and Q10 are kept in conductive state, while the MISFET Q11 is kept in cut-off condition because the line L35 carries a "0" level signal.

In this state, the voltage VL applied through the MISFETs Q9,Q10 via the terminal P10 appears on the line L40. Since the MISFET Q9 conducts, the capacitor CO is in the discharging state.

The A/D conversion is started as the start signal ADSTR which, as shown at (c) in FIG. 8, takes "1" level over a constant time length to to t1 is applied to the sequence control circuit 130 and to the address memory 131.

The output from lines L33,L34 are turned to "0" level at the instant to, as shown at (F) and (G) in FIG. 8, by the sequence control circuit 130, so that the MISFETs Q9 and Q10 are turned to cut-off state.

By turning the MISFETs Q9 and Q10 into cut-off state as described before turning the MISFET Q11 into conductive state, the undesirable formation of DC passage between, for example, the terminal P10 and the grounding portion of the circuit, is conveniently avoided.

As the start signal ADSTR is turned to take the "1" level, the address memory 131 reads the 4-bit signals on the lines L13 to L16 delivered from the CPU 14 (FIG. 4). Meanwhile, the address decoder 132 turns the level of the signal on one of the lines L24 to L31 to "1", upon receipt of the address signal derived from the address memory 131. The counter 135 is reset when the start signal ADSTR takes the "1" level, because it receives the "1" level signal from the line L46.

As the level of the start signal ADSTR is returned to "0" at an instant t1, the sequence control circuit 130 delivers "1" level signal to the lines L32 and L35, as shown at (D) and (E) of FIG. 8.

The "1" level signal on the line L32 acts to open the gate circuit consisting of NOR circuits NR1 to NR8, and the one of the MISFETs Q80 to Q87 selected by the address decoder 132 is turned on. At the same time, the "1" level signal on the line L35 turns the MISFET Q11 on.

Consequently, the capacitor CO comes to be connected through the above-mentioned MISFET which has been turned on between one of the lines L1 to L8 and the grounding terminal of the circuit. Therefore, the charging of the capacitor by the analog input voltage on the lines L0 to L8 is commenced.

The potential of the line L40 connected to one of the terminals of the capacitor CO is changed as shown at (I) in FIG. 8.

The sequence control circuit 130 incorporates therein a timer (not shown) for counting the clock signals $\phi 1, \phi 2$. This circuit 130 changes the level of the signal on the line L32 from "1" to "0" again, as shown at (D) in FIG. 8, at an instant t2 by which the capacitor CO has been charged sufficiently. Consequently, the MISFET which has been selected out of the MISFETs Q80 to Q87 is turned from on state to off state.

At an instant t3, the signal on the line L35 is changed from "1" level to "0" level, so that the MISFET Q11 is turned from on state to off state.

At an instant t4, the signal on the line 34 is turned from "0" level to "1" level, so that the MISFET Q10 is turned from off state to on state. As the MISFET Q10 is turned on, the output voltage VL derived from the potential dividing circuit consisting of the resistors R3,R4 is applied across the other terminal of the capacitor CO.

Consequently, the potential of the line L40 connected to one terminal of the capacitor CO is increased by VL, as shown at (I) in FIG. 8.

The level of the signal on the line L36 is turned from "1" to "0", as shown at (H) in FIG. 8, at an instant t5, so that the MISFET Q7 is turned from the on state to off state, thereby to start the constant-current circuit 133. Simultaneously with the start of the constant-current 133, the level of the signal on the line L45 is turned to "1" as shown at (K) in FIG. 8, so that the counter 135 is instructed to commence the counting.

Since the electric charge on the capacitor CO begins to be discharged from the instant t5 as the constant current through the constant-current circuit 133, the potential of the line L40 is lowered linearly, as the time elapses.

At an instant t6, after the elapse of the time corresponding to the amount of the electric charge at an instant immediately before the commencement of the discharge, the potential of the line L40 is lowered to the level of the threshold voltage VTH of the voltage comparator circuit 134. Thus, the voltage comparator circuit 134 produces a signal which is turned to "0" level at the above-mentioned instant t6, as shown at (J) in FIG. 8.

The sequence control circuit 130 receives the "0" level signal derived from the comparator circuit 134, through the line L43, and delivers signals as shown at (H),(L) and (K) to the lines L36, L44 and L45, at an instant t7 adjusted by the clock signal $\phi 1$. The "1" level signal on the line L36 serves to stop the operation of the constant-current circuit 133, while the counting operation of the counter 135 is stopped by the "0" level signal on the line L45. At the same time, the CPU 14 (FIG. 4) is informed of the completion of the A/D conversion by the "1" level signal on the line L44.

The CPU provides an instruction to write the digital signals held by the counters L47 to L54 in the data area 152 of the memory 15, upon receipt of the A/D conversion completion signal.

At an instant t8, the level of the signal on the line 33 is changed to "1", and the MISFET Q9 is turned into on state. The residual electric charge is discharged from the capacitor CO through this MISFET Q9. At the same time, the A/D conversion completion signal ADEND is again turned to take the "0" level again.

In the next A/D conversion, the content of the address assembly 131 is changed and, at the similar timing to that described above, the signal in the form of a digital signal is delivered to the output line of the counter 135.

In the A/D converter as shown in FIG. 7, the voltage across the capacitor CO and the output voltage VL from the potential dividing circuit are added to each other during the conversion operation. It is therefore possible to apply a voltage across the drain of the MISFET Q1, which is large enough to make the MISFET Q1 saturate, even when the analog input voltage is relatively small. The constant-current circuit 133 therefore provides a highly precise constant current, even for a small analog input signal.

Further, since the arrangement is such that the analog input voltage and the voltage VL are added, even an analog input voltage lower than the threshold voltage of the voltage comparator circuit 134 can fairly be converted into digital signal.

In the circuit as shown in FIG. 7, the count number obtained at the counter 135 for each of the analog voltages on the lines L1 to L6 fluctuates due to the variation of conditions, e.g. fluctuations of the threshold voltage of the voltage comparator circuit 134, fluctuation of the output current of the constant-current circuit 133, temperature change and so forth. Thus, the count number obtained at the counter 135 does not always exhibits the desirable value in relation with the analog input voltage.

Figure 9:
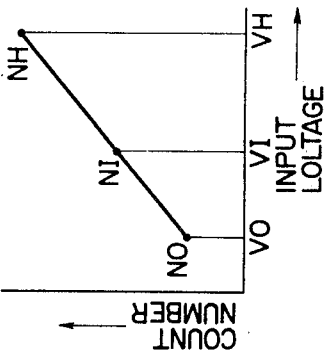
FIG. 9 shows the relationship existing between an analog input voltage and output digital count number.

FIG. 9 shows the characteristic existing between the analog input signal and the count number. In FIG. 9, a symbol VO designates a first analog reference signal which is input to the A/D converter when the MISFET Q87 is selected. This voltage VO is materially 0 (zero) volt. VH denotes a second analog reference voltage which is input to the A/D converter when the MISFET Q80 is selected. This voltage VH is given by the potential dividing circuit consisting of resistors R1,R2. Symbols VI designates an analog input voltage of any desired level, while NO and NH denote, respectively, count numbers corresponding to the input reference voltages VO and VH.

The fluctuation of the characteristic attributable to the temperature change or the like reason does not take place in quite a short time required for the completion of the A/D conversion, so that, as shown in FIG. 9, the point representative of the count number NI is positioned on the straight line interconnecting the points representative of the count numbers NO and NH. Consequently, the ratio of the difference between count numbers NH and NO (NH−NO) to the difference of the count numbers (NI−NO) or to the difference of the count numbers (NH−NO) is proportional to the input voltage VI exactly, even when each of the count numbers NO,NI and NH is fluctuated.

The CPU 14 as shown in FIG. 4 calculates the above mentioned ratio from the count numbers NO,NI and NH which are stored in the memory area 152. Consequently, digital data free from the variation attributable to the fluctuation and variation of the characteristics of the circuits is obtained, through this calculation.

The above explained calculation conveniently diminishes the number of adjusting points in the circuit, so that it can effectively be used in circuits which exhibit themselves a large fluctuation of characteristics, such as semiconductor integrated circuits.

What is claimed is:

1. Signal processing equipment comprising:
   a current circuit including a first and a second insulated gate type field effect transistor connected in series between a first circuit terminal and a reference potential, and
   biasing means for applying a first and a second fixed bias voltages to the gates of the first and the second insulated gate type field effect transistor;
   characterized in that a first switch means (Q8) is connected between an input terminal and said first circuit terminal, that a second switching means (Q7) is connected to said biasing means so as to control the operation of said current circuit, that a capacitor (Co) is interposed between said first circuit terminal and said reference potential, that an input terminal of a voltage detecting means (134) is connected to said first circuit terminal, that a counter (135) is controlled by the signal available at the output terminal of said voltage detecting means, that during the ON condition of said first switching means said capacitor is charged up to a voltage corresponding to the level of an input signal (Vin) applied to said input terminal, that during the OFF condition of said first switching means the electric charge of said capacitor is discharged through said current circuit (1), that a digital signal corresponding to the discharge time (T) is obtained from said counter, and that the levels of said first and said second fixed bias voltages (Vx, Vy) are so determined as to put said second insulated gate type field effect transistor into its saturated condition.

2. Signal processing equipment as claimed in claim 1, characterized in that said biasing means (2) includes a third and a fourth insulated gate type field effect transistors (Q5, Q6) connected in series between a power source voltage ($V_{DD}$) and said reference potential, that the first bias voltage (Vy) is generated at a second circuit terminal between said third and said fourth insulated gate type field effect transistors (Q5, Q6), and that the second switching means (Q7) is connected between said second circuit terminal and said reference potential.

3. Signal processing equipment as claimed in claim 1, characterized in that a plurality of analog signal generating means (DET 1, DET 2 - - - DET 6) is coupled to said first circuit terminal (P8) through a plurality of said first switching means (Q81, Q82 . . . Q86), that selector means (NR2 - - - NR7) controls said plurality of first switching means so as to transmit one of the analog signals from said plurality of analog signal generating means to said first circuit terminal, that said capacitor (Co), said current circuit (1), said bias means (2), said voltage detecting means (134) and said counter (135) are built so as to form an analog-digital converter, that a digital operating circuit (18, 19) is provided so as to receive the output from said analog-digital converter, and that electric-mechanical converting means (SOL1, SOL2, SOL3, RL1) is controlled by said digital operating circuit.

* * * * *